(12) United States Patent
Wilson et al.

(10) Patent No.: US 6,687,129 B1
(45) Date of Patent: Feb. 3, 2004

(54) CIRCUIT BOARD AND FRAME ASSEMBLY

(75) Inventors: Jeremy I. Wilson, Rocklin, CA (US); Thomas J. Augustin, El Dorado Hills, CA (US); Stephan K. Barsun, Auburn, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/230,818

(22) Filed: Aug. 29, 2002

(51) Int. Cl.⁷ ................................. H05K 5/06
(52) U.S. Cl. ................... 361/730; 361/800; 361/797; 361/753; 361/719; 361/801
(58) Field of Search ................... 361/730, 760, 361/740, 688, 709, 719, 753, 687, 720, 752, 797, 800, 796, 724, 714, 801

(56) References Cited

U.S. PATENT DOCUMENTS 4,513,353 A * 4/1985 Bakermans et al. ........ 361/759
5,978,937 A   11/1999 Miyamori et al.
6,381,146 B1   4/2002 Sevier

* cited by examiner

Primary Examiner—Randy Gibson
Assistant Examiner—Hung Bui

(57) ABSTRACT

A circuit board programming/debugging arrangement and method includes a circuit board and frame assembly and a programming/debugging device. The assembly includes a printed circuit board, a first frame section coupled to the circuit board and at least one second frame section coupled to at least one of the circuit board and the first frame section. The second frame section is movable from an operational position to a non-interfering programming/debugging position wherein the second section would interfere with coupling of the programming/debugging device to the circuit board. The programming/debugging device is coupled to the circuit board while the at least one second frame section is in the programming/debugging position.

21 Claims, 10 Drawing Sheets

CIRCUIT BOARD AND FRAME ASSEMBLY

BACKGROUND OF THE INVENTION

Computing devices typically include a circuit board upon which various electronic computing components are mounted. In many instances, it is necessary to debug the board or otherwise identify errors associated with the board itself or its attached components. Debugging the board and attached components generally requires that a debugging device or tool be coupled to the board.

However, in many instances, it is extremely difficult to attach a debugging and/or programming device to the circuit board or its interface for debugging or programming. Frequently, the metal framework supporting the circuit board or its components interferes with connecting the debugging device to the circuit board. As a result, the generally metal framework must be cut and removed to permit debugging of the board. Alternatively, the frame itself must be substantially disassembled from the board, increasing the risk of damaging the board during debugging. As a result, debugging printed circuit boards is tedious, time consuming and potentially dangerous to the circuit board being debugged.

SUMMARY OF THE INVENTION

A circuit board programming/debugging arrangement includes a circuit board and frame assembly and a programming/debugging device. The assembly includes a printed circuit board, a first frame section coupled to the circuit board and at least one second frame section coupled to at least one of the circuit board and the first frame section. The second frame section is movable from an operational position in which the second section would interfere with coupling of the programming/debugging device to the circuit board to a non-interfering programming/debugging position. The programming/debugging device is coupled to the circuit board while the at least one second frame section is in the non-interfering programming/debugging position.

According to another aspect of the present invention, a circuit board and frame assembly for use with a circuit board programming/debugging device includes a printed circuit board, a first frame section coupled to the circuit board, and a second frame section coupled to at least one of the circuit board and the first frame section. The second frame section is movable from an operational position in which the second frame section would otherwise interfere with coupling of a circuit board programming/debugging device to the circuit board to a non-interfering programming/debugging position allowing the coupling of the programming/debugging device to the circuit board.

According to another aspect of the present invention, a method for programming and/or debugging a printed circuit board includes the operations of providing a circuit board and frame assembly having a printed circuit board, a first frame section coupled to the circuit board and at least one second frame section coupled to the circuit board, wherein the at least one second frame section is movable from an operational position in which the at least one second frame section would otherwise interfere with coupling of a circuit board programming device to the circuit board to a non-interfering position allowing the coupling of the programming device to the circuit board. The method further includes the operations of moving the second frame section from the operational position to the non-interfering position, coupling a programming device to the circuit board while the at least one second frame section is in the non-interfering position and running a programming or debugging program.

DETAILED DESCRIPTION OF THE PREFERRED EMBODIMENTS

Figure 1:
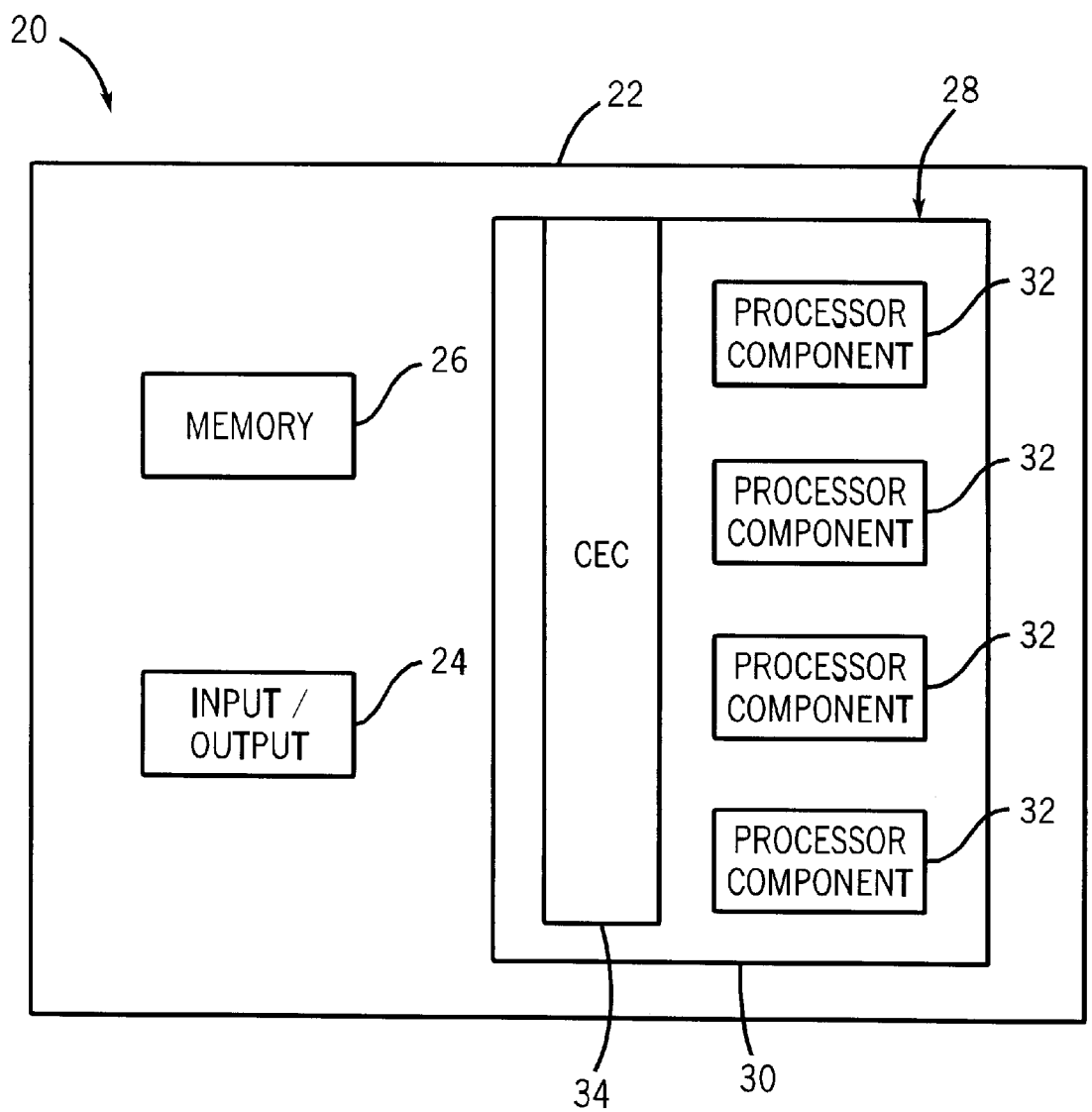
FIG. 1 is a schematic drawing of a computer device having a processor unit including one embodiment of a circuit board and frame assembly of the present invention.

FIG. 1 schematically illustrates a computing device 20, an example of which is a server. Computing device 20 generally includes base board 22, input/output 24, memory 26 and processor 28. Base board 22 connects input/output 24, memory 26 and processor 28 and serves as an electronic highway between such units. Input/output 24 generally comprises an input/output board coupled to base board 22. For purposes of this disclosure, the term "coupled" means the joining of two members directly or indirectly to one another. Such joining may be stationary in nature or movable in nature. Such joining may be achieved with the two members or the two members and any additional intermediate members being integrally formed as a single unitary body with one another or with the two members or the two members and any additional intermediate member being attached to one another. Such joining may be permanent in nature or alternatively may be removable or releasable in nature. The input/output board generally supports a plurality of input/output cards. Input/output 24 facilitates the use of additional peripherals such as tape drives, DVDs and the like with computing device 20.

Memory 26 is coupled to base board 22 and provides additional memory storage for computing device 20. In the particular embodiment shown, memory 26 comprises two memory extenders comprising boards carrying a plurality of memory cards.

Processor 28 does much of the computing or calculations for computing device 20 and generally includes a processor board or circuit board 30, a plurality of processor components 32 and a control 34 (known as a computer electronic control or CEC). Circuit board 30 generally comprises a conventionally known or future developed circuit board (also known as a printed circuit assembly) capable of serving as an interface between the various elements connected to circuit board 30. Circuit board 30 is coupled to base board 22 and electronically connects each of processor components 32 to control 34.

Control 34 serves as a traffic cop between each of the processor components 32 and memory 26. Although not shown, computing device 20 may additionally include a power supply for supplying power to each of the components, one or more cooling fans and a housing for enclosing and supporting each of the components. Overall, input/output 24, memory 26 and processor 28 cooperate with one another to provide information retrieval and processing.

Figure 2:
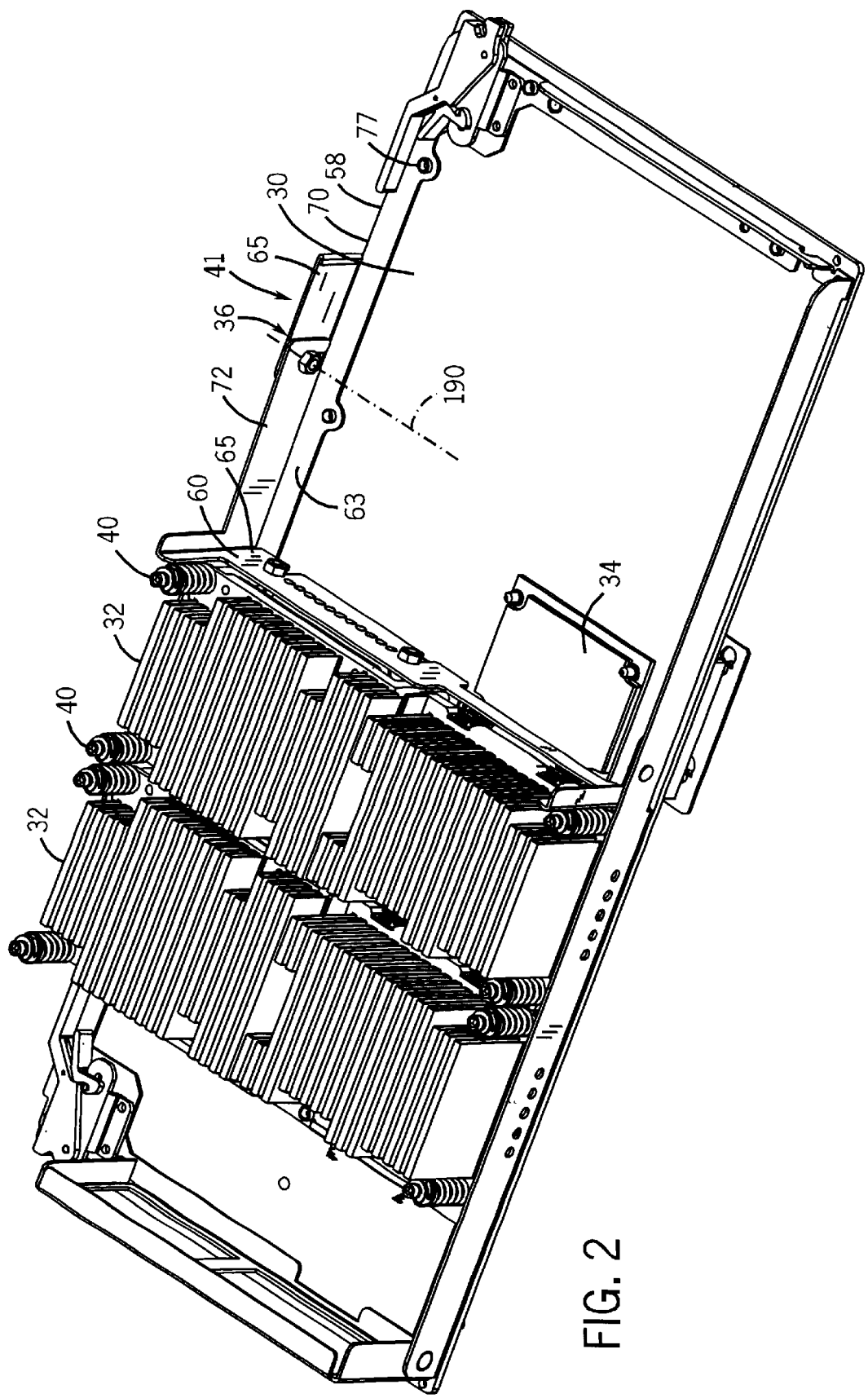
FIG. 2 is a top perspective view of a circuit board and frame assembly of the present invention having processor components attached thereto via attachment mechanisms.

FIGS. 2–9 illustrate a portion of processor 28 including two processor components 32. As shown by FIG. 2, processor 28 additionally includes frame 36 and attachment mechanisms 40. Frame 36 is secured to circuit board 30 to form circuit board and frame assembly 41. Frame 36 rigidifies and supports circuit board 30. Frame 36 protects circuit board 30 from warpage and damage due to vibration and shock. In the particular embodiment illustrated, frame 36 additionally supports attachment mechanisms 40 which secure and retain processor components 32 relative to circuit board 30. A detailed description of components 32 as well as attachment mechanisms 40 is provided in co-pending U.S. patent application Ser. No. 10/230,771 entitled CIRCUIT BOARD SUPPORT ASSEMBLY filed on the same date herewith by Stephan K. Barsun, Steven R. Hahn and Thomas J. Augustin, the full disclosure of which is hereby incorporated by reference.

Although less desirable, frame 36 may be employed in alternative arrangements wherein electronic components such as components 32 are mounted directly to circuit board 30 rather than frame 36 and wherein other mechanisms besides attachment mechanisms 40 are employed. Although frame 36 is illustrated as being formed from deformed sheet metal, frame 36 may alternatively be formed from cast metal, machined metal or polymeric material.

Frame 36 generally includes perimeter portions 58 and spanning portions 60. Perimeter portions 58 extend around the perimeter of circuit board 30 to circumscribe circuit board 30. In contrast, spanning portions 60 extend between opposite perimeter portions 58 across circuit board 30 to further rigidify intermediate portions of circuit board 30. Perimeter portions 58 generally include a circuit board abutting panel 63 and an extending panel 65. Abutting panels 63 extend generally parallel to circuit board 30. Abutting panels 63 generally provide surfaces by which frame 36 is secured to circuit board 30. Abutting panels 63 also provide surfaces by which attachment mechanisms 40 are coupled to frame 36.

Extending panels 65 generally extend from abutting panels 63 non-parallel to circuit board 30. In the particular embodiments illustrated, extending panels 65 extend substantially perpendicular to circuit board 30. Extending panels 65 greatly enhance the rigidity of frame 36. Although spanning portion 60 is illustrated as only including an extending panel 65, spanning portion 60 may additionally include an abutting panel 63 adjacent to circuit board 30.

Frame 36 generally consists of a generally fixed frame section 70 and a movable section 72. Fixed section 70 comprises that portion of frame 36 which is coupled to circuit board 30 in a more permanent fashion as compared to movable section 72. In the particular embodiment illustrated, fixed section 70 comprises a majority of frame 36 and is fixed to circuit board 30 along multiple connection points located about substantially an entire perimeter of circuit board 30. Fixed section 70 includes both abutting panels 63 and extending panels 65. Fixed section 70 provides at least part of perimeter portions 58 and spanning portions 60. In the particular embodiment illustrated, fixed section 70 is secured to circuit board 30 by a plurality of fasteners 77 located about a perimeter of circuit board 30. Fixed section 70 is further secured to circuit board 30 by attachment mechanisms 40. Although fixed section 70 is illustrated as being formed by multiple segments permanently fastened or joined to one another and fixed to circuit board 30 or multiple segments individually fixed to circuit board 30, fixed section 70 may alternatively be provided by a single continuous unitary structure extending at least partially about or along circuit board 30.

Movable section 72 generally comprises a portion of frame 36 that is movable relative to the remainder of frame 36. Movable section 72 moves from an operational position where section 72 would otherwise interfere with coupling of a circuit board programming device to circuit board 30 to a non-interfering position allowing the coupling of a programming device to circuit board 30. In the particular embodiment illustrated, the programming device is coupled to circuit board 30 via control 34. When moved from the operational position shown in FIG. 1 to the non-interfering position, movable section 72 permits a programming device to be coupled to control 34 as will be described in greater detail hereafter.

Figure 3:
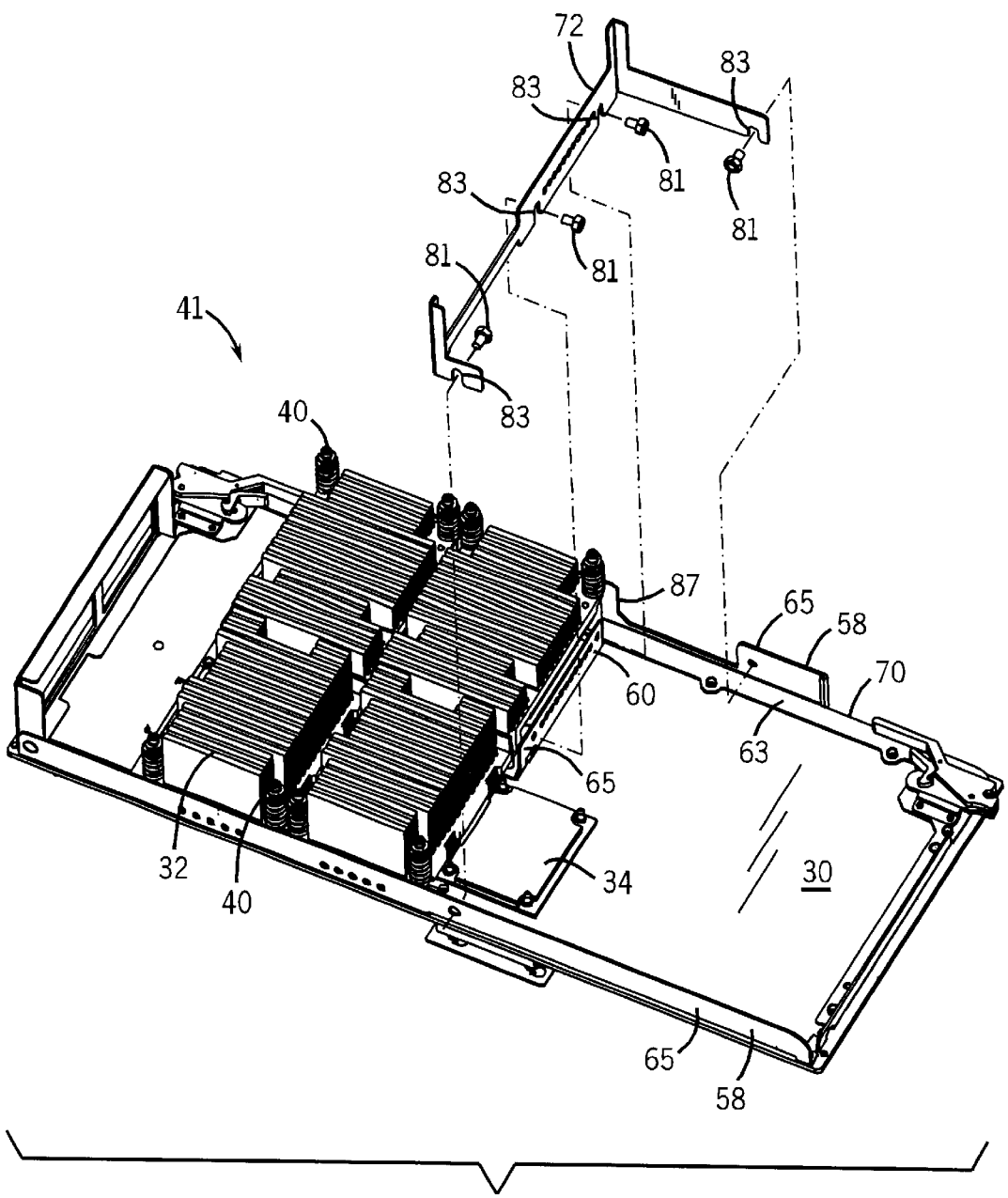
FIG. 3 illustrates a circuit board and frame assembly of FIG. 2 with a movable frame section in a non-interfering position.

FIG. 3 illustrates the movement of movable section 72 to the non-interfering position. Movement of section 72 to the non-interfering position (i.e. complete detachment from section 70), results in an opening 87 in extending panel 65 of section 70. Opening 87 is configured to allow a programming/debugging tool to be coupled to control 34 and to extend through opening 87 beyond circuit board 30.

Movable section 72 generally comprises a plurality of extending panels 65 which extend along side of extending panels 65 of fixed section 70. Movable section 72 cooperates with fixed section 70 to form a part of perimeter portion 58 and spanning portion 60. When in the operational position, movable portion 72 cooperates with fixed section 70 to rigidify circuit board 30 and extends adjacent to control 34.

As best shown by FIG. 3, movable section 72 is completely detachable from fixed section 70 to move from the operational position to a non-interfering position. Such movement of movable section 72 is achieved without cutting, severing or deforming sections 70 or 72. Likewise, such movement of movable section 72 is achievable without uncoupling fixed section 70 from circuit board 30, enabling section 70 to continue to protect circuit board 30 from damage.

Extending panels 65 of fixed section 70 and movable section 72 overlap or extend substantially parallel and adjacent to one another when movable section 72 is in the operational position. Such overlapping surfaces of sections 70 and 72 are held together by frame retainers 81. Frame retainers 81 are actuatable between an attaching position in which frame retainers 81 inhibit relative movement of the overlapping portions of sections 70, 72 to attach section 72 to section 70 and a detaching position in which the overlapping portions of sections 70 and 72 may be moved relative to one another. In the particular embodiment illustrated, at least one of movable section 72 and fixed section 70 includes elongated open-ended slots 83. When in the attaching position, retainers 81 extend through slots 83 to force the overlapping portions of sections 70 and 72 into frictional engagement with one another to prevent relative movement of the overlapping portions of sections 70 and 72. Simply loosening retainers 81 to lessen the frictional resistance between the overlapping portions of sections 70 and 72 enables movable section 72 to be simply lifted to the non-interfering position. Although less desirable, retainers 81 may alternatively extend through a pair of aligned bores within sections 70 and 72, requiring at least partial withdrawal of retainers 81 to permit separation of section 72 from section 70.

Although retainers 81 are illustrated as fasteners which either thread into threaded bores in fixed section 70 or that extend through section 70 and engage a nut, retainers 81 may alternatively comprise latches, slides, locks or other conventionally known or future developed mechanisms that temporarily attach section 72 to section 70 while permitting section 72 to be detached without severing or permanently deforming section 70. For example, retainers 81 may alternatively comprise one or more latches that are resiliently biased into latching engagement with section 72. Although section 72 is illustrated as being joined to section 70 by having portions of section 70 and 72 overlap one another, section 72 may alternatively be joined to section 70 by an end-to-end attachment arrangement or an arrangement in which one of portions 70 and 72 receives the other of portions 70 and 72.

Figure 4:
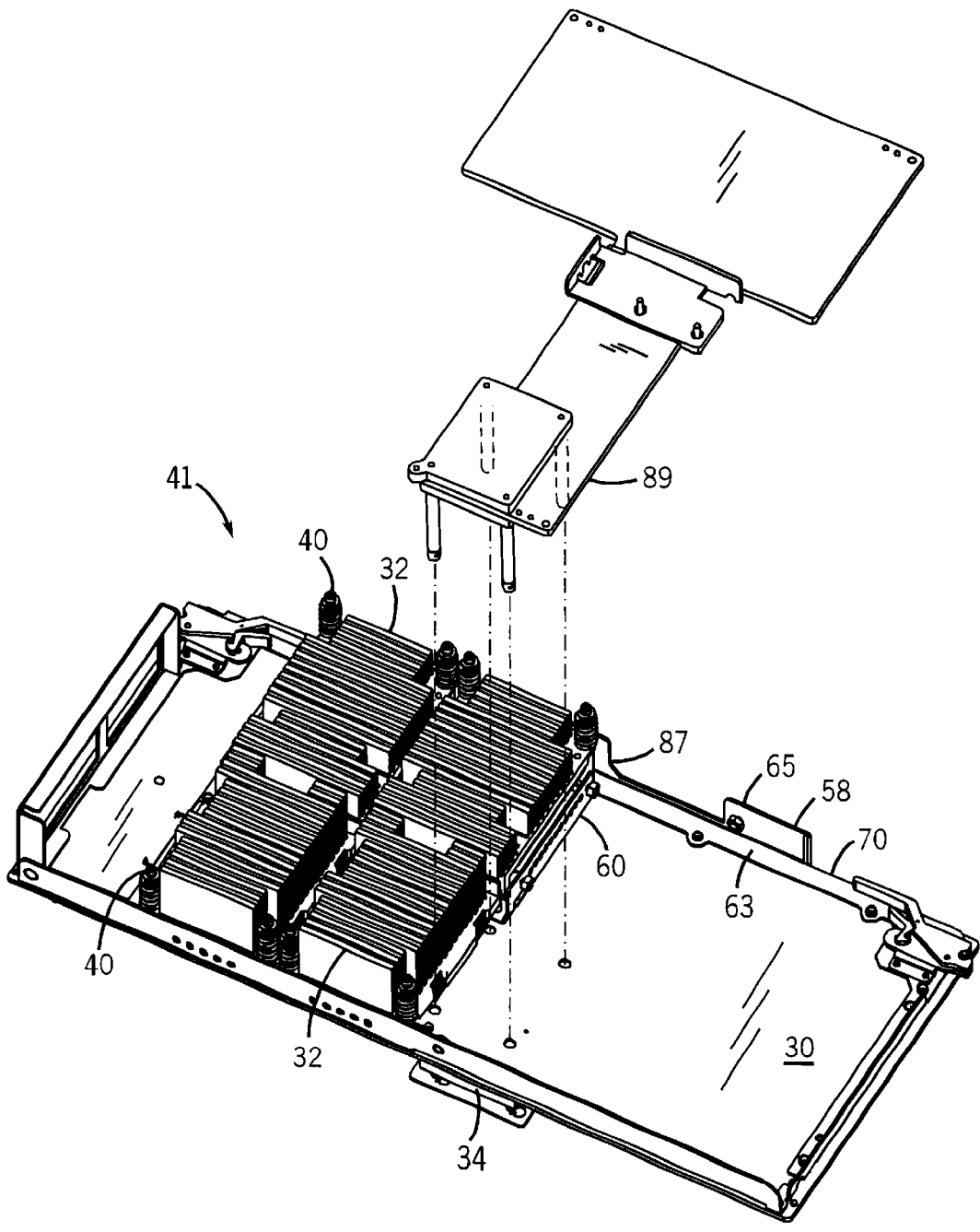
FIG. 4 is a top perspective view of a circuit board and frame assembly positioned relative to a circuit board programming/debugging device.
Figure 5:
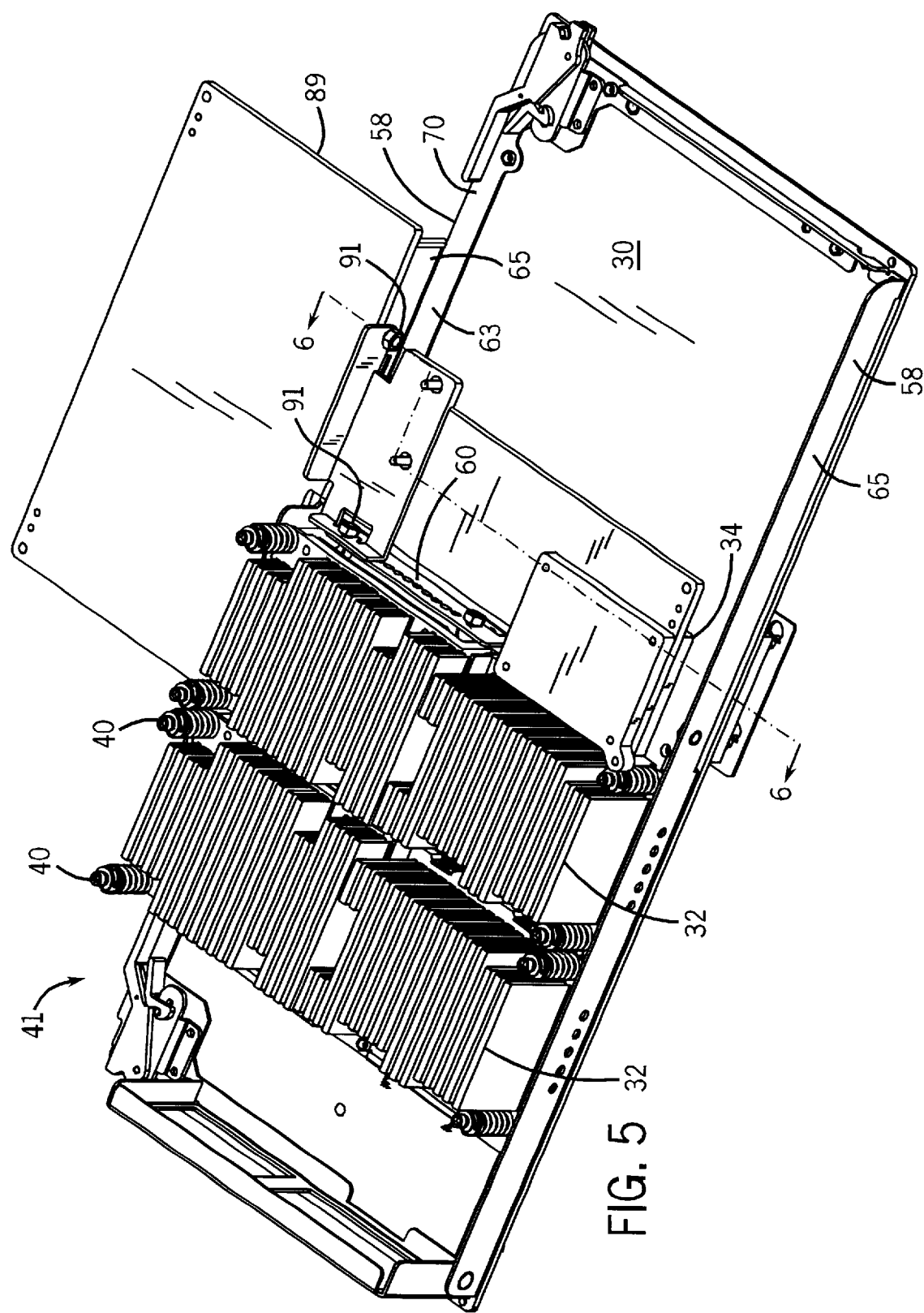
FIG. 5 is a top perspective view of the circuit board assembly of FIG. 4 illustrating the programming/debugging device coupled to the circuit board to form a programming/debugging arrangement.
Figure 6:
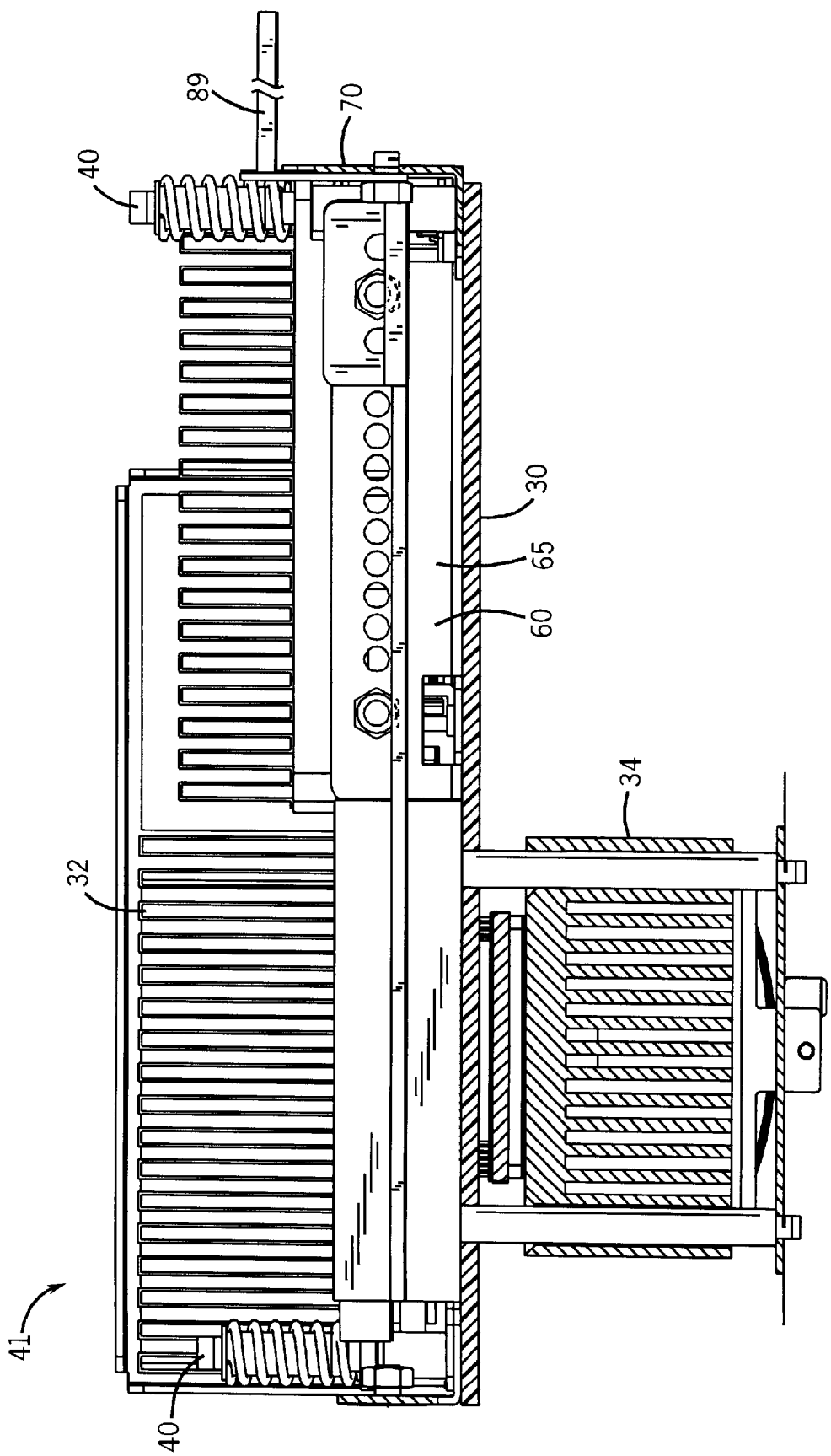
FIG. 6 is a sectional view of the programming/debugging arrangement of FIG. 5 taken along line 6—6.

Once section 72 is moved to the non-interfering position, a circuit board programming or debugging device may be coupled to control 34 without interference from the remainder of frame 36. FIGS. 4–6 illustrate a circuit board programming/debugging arrangement in which section 72 is moved to a non-interfering position and in which a programming/debugging device 89 is coupled to circuit board 30 via control 34. The programming/debugging device 89 comprises a device that serves as a process monitor, analyzer or logic probe that reads input to processor 28 and output from processor 28. Device 89 may have a variety of different configurations and features depending upon its desired function.

As shown by FIGS. 4–6, programming device 89 extends beyond frame 36 and passes through opening 87 to couple to control 34 which is coupled to circuit board 30. The removal of removable frame section 72 further facilitates the mounting of device 89 to fixed frame section 70. In particular, device 89 is mounted to frame section 70 utilizing the same mounting portions of section 70 which are used to mount section 72. As shown by FIGS. 5 and 6, retainers 91 extend through portions of device 89 to secure device 89 to frame section 70. As a result, device 89 is securely mounted to section 70 without modifications to frame section 70.

Figure 7:
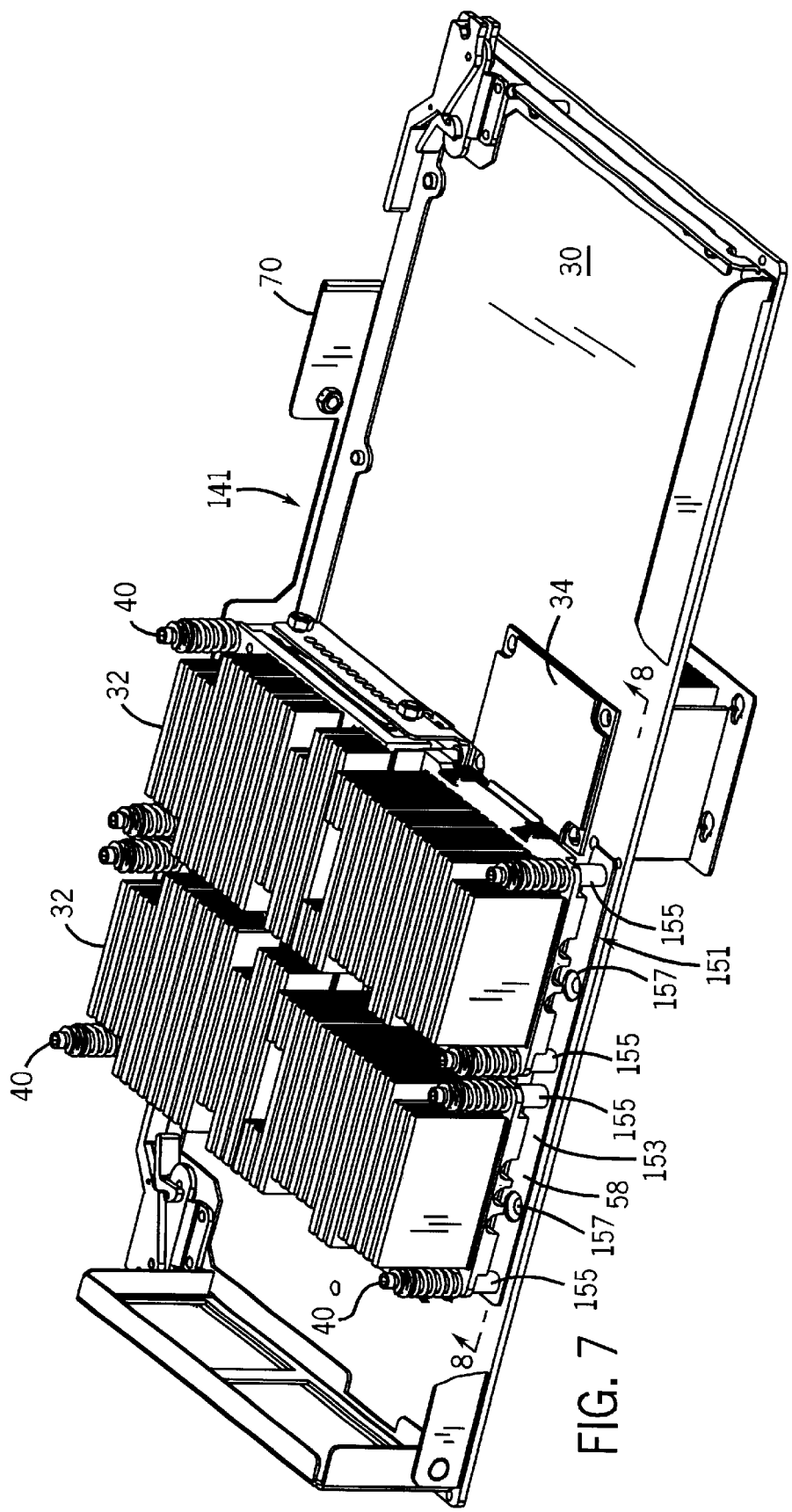
FIG. 7 is a fragmentary top perspective view of an alternative embodiment of a circuit board and frame assembly shown in FIG. 1.
Figure 8:
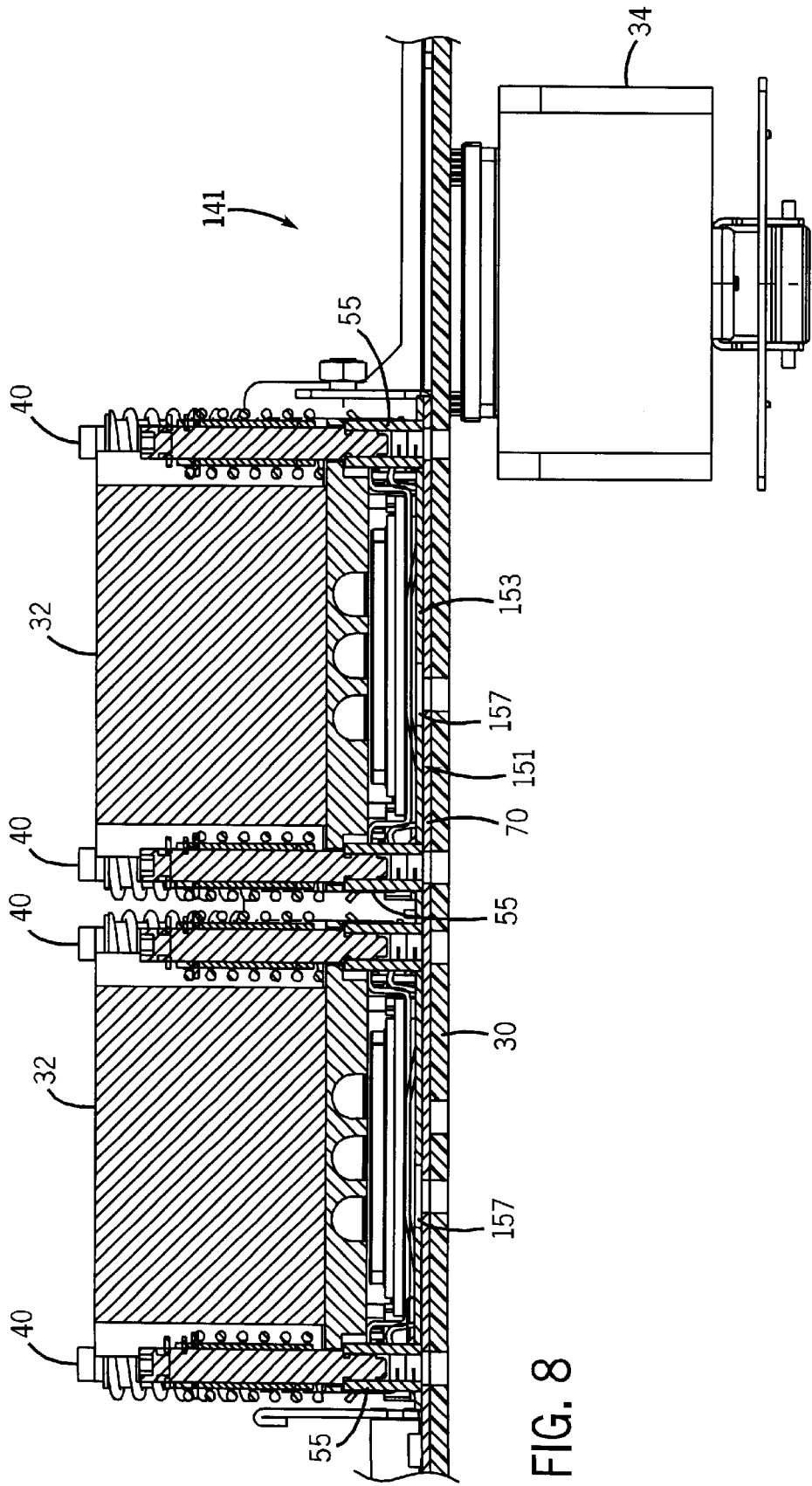
FIG. 8 is a sectional view of the circuit board and frame assembly of FIG. 7 taken along line 8—8.

FIGS. 7–10 illustrate circuit board and frame assembly 141, an alternative embodiment of circuit board and frame assembly 41 shown in FIGS. 2–6. FIG. 7 illustrates frame section 151 in the operational position in which frame section 151 rigidifies and protects circuit board 30 and provides a structure for mounting components 32. Circuit board and frame assembly 141 is similar to circuit board and frame assembly 41 except that circuit board and frame assembly 41 additionally includes movable frame section 151. Movable section 151 generally includes a base 153 and at least one component mount 155. Base 153 generally comprises an elongate flat abutting panel 58 configured to support component mounts 155. Base 58 is coupled to fixed section 70 by fasteners (not shown) extending through apertures 157.

Component mounts 155 extend from base 153 and are configured to mount and support electronic components relative to circuit board 30. In the particular embodiment illustrated, component mounts 155 comprise standoffs non-rotatably coupled to base 153 by being pressed into base 153. Component mounts 155 serve as part of attachment mechanisms 40 as described in co-pending U.S. patent application Ser. No. 10/230,807 entitled CIRCUIT BOARD SUPPORT ASSEMBLY filed on the same date herewith by Stephan K. Barsun, Steven R. Hahn and Thomas J. Augustin, the full disclosure of which is hereby incorporated by reference. In alternative embodiments, various other component mount structures may be utilized in lieu of the standoffs shown.

Figure 9:
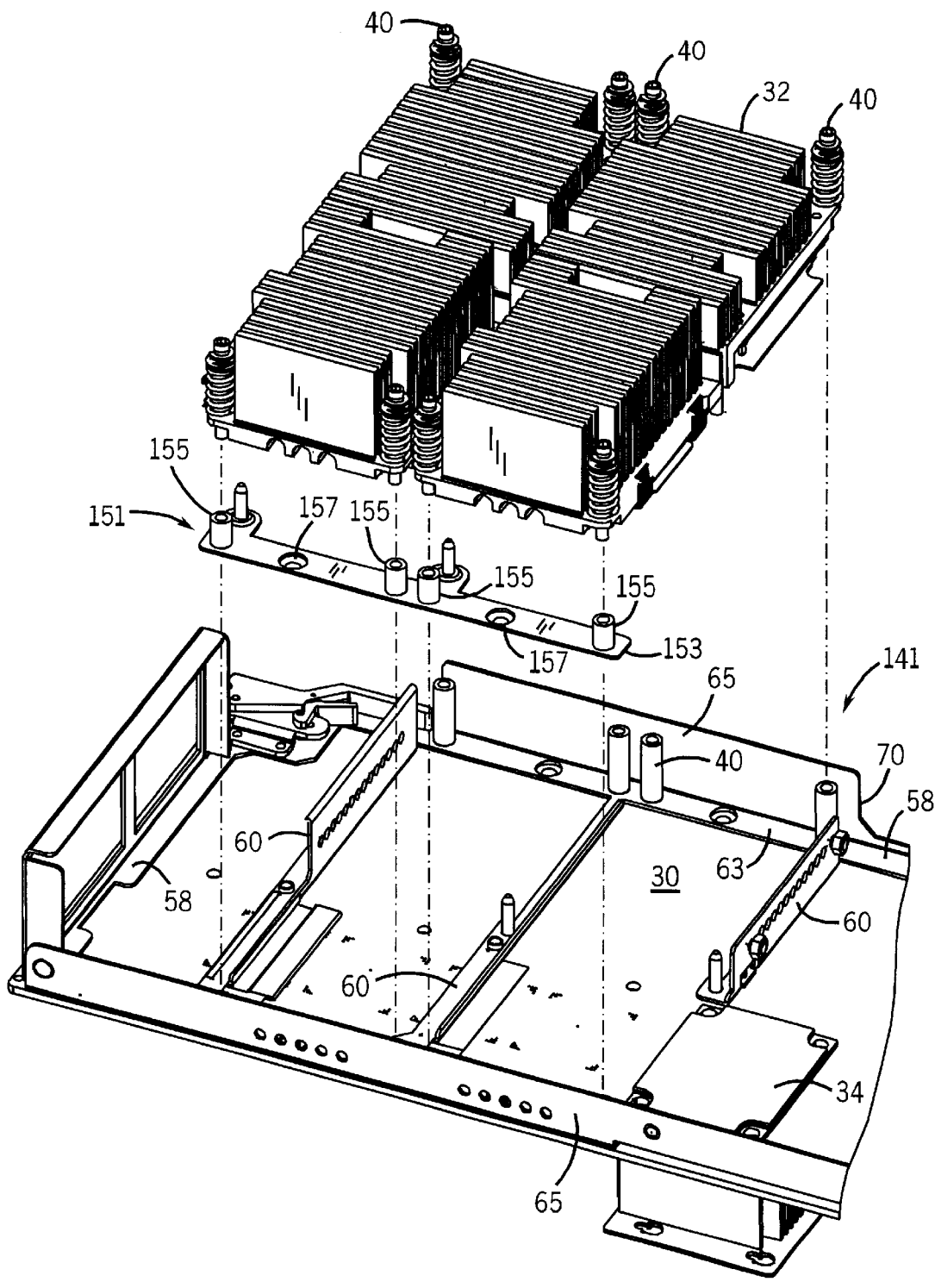
FIG. 9 is a top perspective view illustrating the circuit board and frame assembly of FIG. 6 with a movable frame section in a non-interfering position.

FIG. 9 illustrates the removal of components 32 and the movement of frame section 151 to a non-interfering position. To move frame section 151 to the non-interfering position, frame section 151 is completely detached from circuit board 30. In particular, the fasteners (not shown) which normally extend through apertures 157 are removed, allowing section 151 to be completely lifted from circuit board 30. Because base 153 supports each of component mounts 155, detachment of section 151 results in all of component mounts 155 being simultaneously detached and removed. As a result, component mounts 155 do not need to be individually separated and removed, facilitating quicker and more efficient modification of frame 36 for debugging or programming.

Like movable frame section 72, movable frame section 151 allows a debugging or programming device to be coupled to circuit board 30 without requiring substantial removal or detachment of frame 36 from circuit board 30 and without requiring cutting or other substantial altering of frame 36. Consequently, the majority of frame 36 is left intact about circuit board 30 to provide continued protection of circuit board 30 during programming or debugging.

Figure 10:
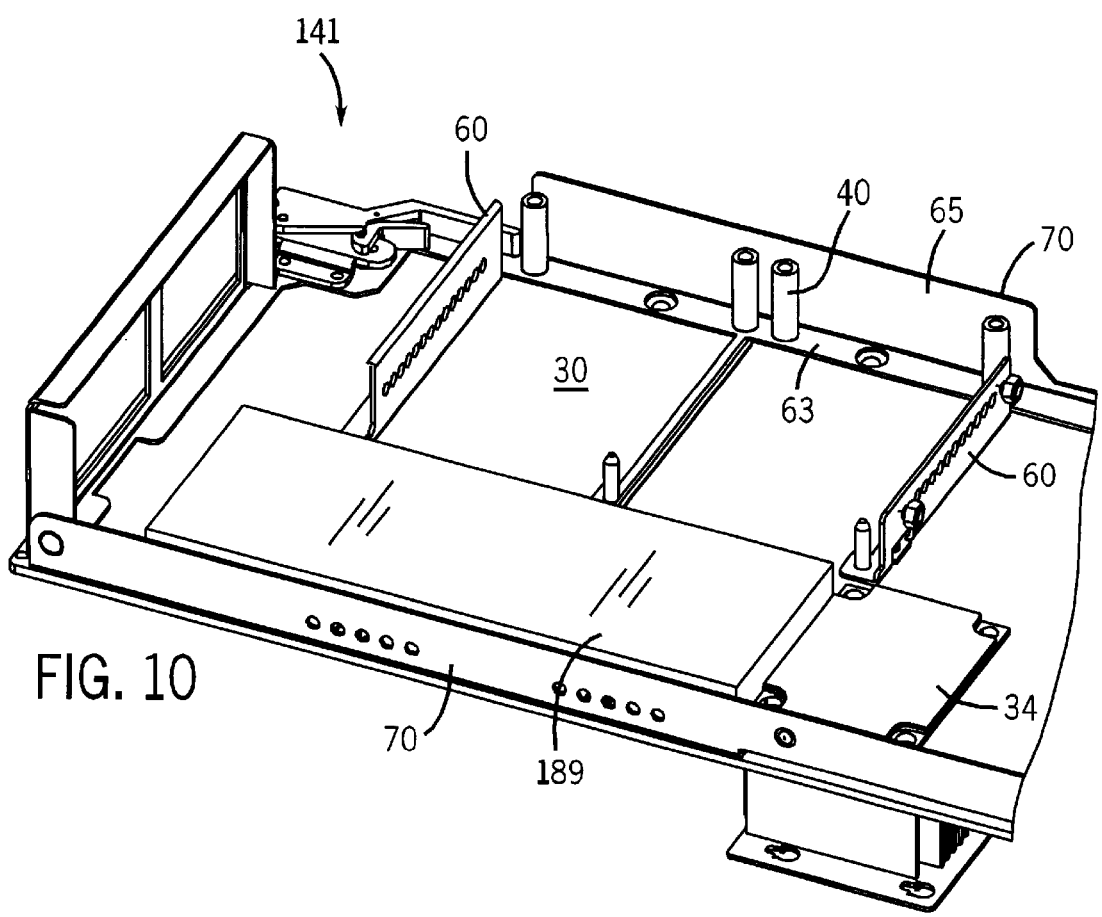
FIG. 10 is a top perspective view of a programming/debugging arrangement in which a schematically illustrated debugging/programming device is coupled to a circuit board of the circuit board and frame assembly shown in FIG. 9.

FIG. 10 illustrates a programming or debugging arrangement in which a programming or debugging device 189 (schematically shown) is coupled to circuit board 30 while frame section 151 is in the non-interfering position (i.e. completely detached from circuit board 30). Debugging device 189 comprises a logic analyzer or logic probe such as a commerically available Agilent front side bus probe. As shown by FIG. 10, frame section 151 and component mounts 155 would otherwise interfere with the coupling of device 189 to circuit board 30 if section 151 was left in the operational position shown in FIG. 7.

Although frame section 151 is illustrated as being coupled directly to abutting panel 63 of section 70, frame section 151 may alternatively be coupled directly to the adjacent extending panel 65 of fixed frame section 70. In such an alternative embodiment, fasteners would connect section 70 to section 151. Removal or loosening of such fasteners or retainers would permit separation and detachment of section 151 from section 70. In yet other alternative embodiments, section 151 may be coupled directly to circuit board 30.

Overall, movable frame sections 72 and 151 facilitate programming and/or debugging of circuit board 30 or components mounted to circuit board 30 by enabling frame 36 to be quickly and easily adapted to accommodate a debugging or programming device. Although frame sections 72 and 151 are illustrated as being particular portions of frame 36, the exact configuration and location of the section of frame 36 that is movable may be varied depending upon the location and configuration of the debugging or programming interface provided for circuit board 30. For example, in the embodiment illustrated, control 34 provides the interface for circuit board 30. Depending upon the location of control 34 as well as the configuration of control 34, the location and configuration of the movable frame section 72 or 151 may also be varied. Furthermore, the configuration and location of either or both of movable frame section 72 or 151 may also be varied depending upon the type and configuration of electronic components, the configuration of circuit board 30 and the configuration of frame 36 as a whole.

Although frame sections 72 and 151 are both illustrated as being completed detached from circuit board 30 and frame section 70 when in the non-interfering position, frame sections 72 and 151 may alternatively be moved to the non-interfering position by other means such as by pivoting from the operational position to the non-interfering position or by sliding from the operational position to the non-interfering position. For example, in one alternative embodiment, frame section 72 may be pivotally coupled to frame section 70 so as to pivot to the non-interfering position. In particular, section 72 may alternatively be configured to pivot about an axis 190 (shown in FIG. 2) relative to frame section 70. In yet another alternative embodiment, base 153 may alternatively be slidably coupled to the portion of frame section 70 to enable base 153 to slide from its operational position to a non-interfering position.

Although the present invention has been described with reference to preferred embodiments, workers skilled in the art will recognize that changes may be made in form and detail without departing from the spirit and scope of the invention. For example, although different preferred embodiments may have been described as including one or more features providing one or more benefits, it is contemplated that the described features may be interchanged with one another or alternatively be combined with one another in the described preferred embodiments or in other alternative embodiments. Because the technology of the present invention is relatively complex, not all changes in the technology are foreseeable. The present invention described with reference to the preferred embodiments and set forth in the following claims is manifestly intended to be as broad as possible. For example, unless specifically otherwise noted, the claims reciting a single particular element also encompass a plurality of such particular elements.

What is claimed is:

1. A circuit board and frame assembly for use with a circuit board programming/debugging device, the assembly comprising:
    a printed circuit board configured to be connected to the circuit board programming/debugging device such that the device occupies a volume in space when coupled to the printed circuit board;
    a first frame section coupled to the circuit board; and
    a second frame section coupled to at least one of the circuit board and the first frame section, wherein the second frame section is movable from an operational position in which the second frame section extends into the volume and would otherwise interfere with coupling of a circuit board programming/debugging device to the circuit board to a non-interfering position in which the second frame section is removed from the volume allowing the coupling of the programming/debugging device to the circuit board.

2. The assembly of claim 1, wherein the second frame section extends in a plane non-parallel to the circuit board.

3. The assembly of claim 1, wherein the second frame section is movable to the non-interfering position by complete detachment from the first frame section.

4. The assembly of claim 3, wherein the first frame section and the second frame section have overlapping portions when the second frame section is in the operational position and wherein the assembly includes a frame retainer actuatable between an attaching position in which the frame retainer inhibits relative movement of the overlapping portions to attach the second frame section to the first frame section and a detaching position in which the overlapping portions may be moved relative to one another.

5. The assembly of claim 4, wherein the overlapping portions frictionally engage one another to prevent relative movement of the overlapping portions when the frame retainer is in the attaching position.

6. The assembly of claim 4, wherein the frame retainer extends through both overlapping portions in the attaching position and extends through only one of the overlapping portions in the detaching position.

7. The assembly of claim 2, wherein one of the first frame and the second frame sections includes an open-ended slot receiving the frame retainer.

8. The assembly of claim 1, wherein the second frame section extends across the printed circuit board when in the operational position.

9. The assembly of claim 8, wherein the first frame section forms an opening and wherein the second frame section extends across the opening when in the operational position.

10. The assembly of claim 1, wherein the second frame section includes:
    a base; and
    a plurality of component mounts coupled to the base, wherein the base is movable between the operational position and the non-interfering position.

11. The assembly of claim 10, wherein the base is removably coupled to at least one of the first frame section and the circuit board.

12. The assembly of claim 10, wherein the plurality of component mounts includes at least one standoff.

13. The assembly of claim 12, wherein the at least one standoff is non-rotatably coupled to the base.

14. The assembly of claim 12, wherein the at least one standoff includes opposite internally threaded bores.

15. A circuit board programming arrangement comprising:
    a circuit board and frame assembly including:
        a printed circuit board;
        a first frame section coupled to the circuit board; and
        at least one second frame section coupled to at least one of the circuit board and the first frame section and movable from an operational position to a non-interfering position; and
    a programming/debugging device coupled to the circuit board and occupying a volume in space while the at least one second frame section is in the non-interfering position, wherein the at least one second frame section extends into the volume and would interfere with coupling of the programming device to the circuit board in the operational position, and wherein the at least one second frame section is removed from the volume in the non-interfering position.

16. The arrangement of claim 15, wherein the second frame section extends in a plane non-parallel to the circuit board.

17. The arrangement of claim 15, wherein the second frame section includes:

a base; and a plurality of component mounts coupled to the base, wherein the base is movable between the operational position and the interfering position.

18. The arrangement of claim 15 including a processor, wherein the programming device detects input to the processor and output from the processor.

19. A method for programming a printed circuit board, the method comprising:

providing a circuit board and frame assembly having a printed circuit board configured to be connected to a programming device such that the device occupies a volume in space when coupled to the printed circuit board, a first frame section coupled to the circuit board and a second frame section coupled to the circuit board, wherein the second frame section is movable from an operational position in which the second frame section extends into the volume and would otherwise interfere with coupling of a circuit board programming device to the circuit board to a non-interfering position in which the second frame section is removed from the volume, allowing the coupling of the programming device to the circuit board;

moving the second frame section from the operational position to the non-interfering position;

coupling a programming device to the circuit board while the second frame section is in the non-interfering position; and running a programming program.

20. The method of claim 19 including completely separating the second frame section from the first frame section.

21. The method of claim 19 including removably attaching the programming device to the first frame section.

* * * * *